(12) United States Patent
Garrity et al.

(10) Patent No.: US 6,940,168 B2
(45) Date of Patent: Sep. 6, 2005

(54) ENHANCED PAD DESIGN FOR SUBSTRATE

(75) Inventors: John Joseph Garrity, Strathclyde (GB); John James Hannah McMorran, Largs (GB)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 09/804,534

(22) Filed: Mar. 12, 2001

(65) Prior Publication Data

US 2001/0010321 A1 Aug. 2, 2001

Related U.S. Application Data

(62) Division of application No. 09/452,259, filed on Dec. 1, 1999, now Pat. No. 6,199,741.

(30) Foreign Application Priority Data

Dec. 9, 1998 (GB) ................................................ 9826943

(51) Int. Cl.[7] .......................... H01L 23/48; H05K 1/14; H05K 3/34
(52) U.S. Cl. ....................... 257/738; 257/737; 257/778; 257/779; 257/780; 257/781; 257/668; 257/772; 257/703; 257/734; 228/180.22; 228/103; 228/104; 228/105; 228/254; 174/261; 174/260; 174/266; 361/767; 361/768; 361/760; 29/832; 29/833; 29/840
(58) Field of Search ................................ 257/738, 737, 257/734, 777, 778–781, 786, 698, 692, 653, 668, 772, 703; 228/180.22, 103–105, 125, 254; 174/260, 261, 266; 361/767, 768, 760; 29/832, 833, 840

(56) References Cited

U.S. PATENT DOCUMENTS 5,147,084 A * 9/1992 Behun et al. ................ 228/254
5,184,768 A * 2/1993 Hall et al. ................... 228/104

(Continued)

FOREIGN PATENT DOCUMENTS

| GB | 2 208 569 A | 4/1989 | ............ H05K/1/18 |
| GB | 2 283 863 A | 5/1995 | ............ H05K/1/18 |
| GB | 2 293 564 A | 4/1996 | ............ B23K/35/02 |
| JP | 9-219583 | * 8/1997 | |
| JP | 11-4067 | * 1/1999 | |
| JP | 11-233936 | * 8/1999 | |
| JP | 2001-284789 | * 10/2001 | |

OTHER PUBLICATIONS

Circuits Assembly (USA), vol. 6, No. 3, Mar. 1995, pp. 38–40.

Primary Examiner—Alexander Oscar Williams
(74) Attorney, Agent, or Firm—Schmeiser, Olsen & Watts; Willams H. Steinberg

(57) ABSTRACT

A ball grid array electronic package is attached to a substrate by means of solder balls and solder paste. Connection is made between a contact on the ball grid array and a solder ball by means of a first joining medium, such as a solder paste. Connection is made between a solder ball and a contact arranged on the substrate by means of a second joining medium. The contact arranged on the substrate is substantially quadrilateral in shape, and preferably substantially square in shape. Connection to the substrate, e.g., using round solder balls, is much more easily detected, e.g., by x-ray, than when using round pads, especially those having a smaller diameter than the balls.

7 Claims, 2 Drawing Sheets

U.S. PATENT DOCUMENTS

| | | | | |
|---|---|---|---|---|
| 5,489,750 A | * | 2/1996 | Sakemi et al. | 174/261 |
| 5,541,449 A | * | 7/1996 | Crane et al. | 257/692 |
| 5,574,801 A | | 11/1996 | Collet-Beillon | |
| 5,591,941 A | * | 1/1997 | Acocella et al. | 257/737 |
| 5,592,562 A | * | 1/1997 | Rooks | 29/830 |
| 5,675,179 A | * | 10/1997 | Shu et al. | 257/668 |
| 5,719,952 A | * | 2/1998 | Rooks | 382/150 |
| 5,828,128 A | * | 10/1998 | Higashiguchi et al. | 257/738 |
| 5,859,474 A | * | 1/1999 | Dordi | 257/737 |
| 5,891,754 A | * | 4/1999 | Bowles et al. | 438/108 |
| 6,046,068 A | * | 4/2000 | Orava et al. | 438/57 |
| 6,337,445 B1 | * | 1/2002 | Abbott et al. | 174/260 |
| 6,340,113 B1 | * | 1/2002 | Avery et al. | 228/248.5 |
| 6,678,948 B1 | * | 1/2004 | Benzler et al. | 29/840 |
| 2001/0031868 A1 | * | 10/2001 | Saikali et al. | 544/323 |
| 2002/0053466 A1 | * | 5/2002 | Kusui | 174/260 |

* cited by examiner

ENHANCED PAD DESIGN FOR SUBSTRATE

CROSS-REFERENCE TO COPENDING APPLICATION

This application is a divisional application of Ser. No. 09/452,259, filed Dec. 1, 1999. now U.S. Pat. No. 6,199,741.

TECHNICAL FIELD

The present invention relates to printed circuit boards and more particularly to printed circuit boards having a plurality of conductive pads for the attachment of an electronic package by means of solder balls.

BACKGROUND OF THE INVENTION

An electronic package typically includes a circuitized substrate with one or more active devices attached thereon. The use of attach materials, such as an adhesive, is common in electronic packaging applications for attaching the devices to the substrate, particularly in Ball Grid Array (BGA) packages.

BGA packages are a relatively recent development in the electronic packaging industry, replacing current products such as Quad Flat Packs (QFP). The main difference is the connection system to the printed circuit board (PCB), also called second level attachment, that is made through eutectic tin-lead solder alloy balls arranged in a matrix layout on the bottom side of the BGA package, instead of metal leads placed along the peripheral corner of the plastic component body. BGA and QFP packages are described in "Circuits Assembly (USA)—Vol. 6, No. 3, March, 1995 pages 38–40".

U.S. Pat. No. 5,574,801 discloses a method of inspecting an array of solder balls used as connections in integrated circuit modules. The method checks the deviation of the balls from a best fitting plane through the balls in order to ensure that the array is flat. If the array is not flat, then one or more of the balls may fail to make an electrical connection with the PCB.

In order to check that all of the electrical connections have been made between the balls and the PCB, the completed assembly may be inspected with the use of X-Rays. The size and location of the connections, especially those internally positioned, do not allow inspection with the naked eye. However, it can be very difficult to determine, when inspecting from above with X-Rays, whether a solder connection has formed successfully or not. A round dark image appears of the ball and corresponding circular pad whether or not a solder connection is made, making detection difficult.

One solution to this problem is to use X-Ray Laminography. An X-Ray Laminography machine can produce synthetic X-Ray sections through the connection, allowing the 3-dimensional shape to be assessed and a determination made as to whether a good solder connection has been made. However, such X-Ray Laminography equipment is relatively expensive.

It is believed, therefore, that an enhanced pad design for an electronic package in which a simple X-Ray process would readily identify those connections which have not been made, without recourse to an X-Ray Laminography machine, would represent a significant advancement in the art.

OBJECTS AND SUMMARY OF THE INVENTION

It is a primary object of the invention to enhance the art of electronic substrates and particularly those of the PCB variety.

It is another object to provide an enhanced conductor pad design for such a substrate which is especially adapted for receiving solder balls.

It is a still further object of the invention to provide such a substrate structure which can be produced economically and does not require complicated testing equipment or methods.

In one aspect of the invention, there is provided a substrate for the attachment of ball grid array electronic packages thereto by means of solder balls and a joining medium wherein connection is made between a contact on the ball grid array electronic package and a solder ball by means of a first joining medium and between a solder ball and a contact arranged on the substrate by means of a second joining medium and wherein the contact arranged on the substrate is substantially quadrilateral in shape.

According to another aspect of the invention, there is provided a method of attaching a ball grid array electronic package to a substrate comprising the steps of: applying a first joining medium to a plurality of contacts located on the ball grid array; locating a solder ball on each of the plurality of contacts of the ball grid array; heating the ball grid array to a temperature sufficient to join each of the solder balls to the corresponding contact on the ball grid array by means of the first joining medium; applying a second joining medium to a plurality of contacts located on the substrate; positioning the substrate and the ball grid array such that each of the solder balls is located adjacent its corresponding contact located on the substrate, the corresponding contact being substantially quadrilateral in shape; heating the ball grid array to a temperature sufficient to join each of the solder balls to the corresponding contact on the substrate by means of the second joining medium; and inspecting, by means of X-Ray, the connection formed between the ball grid array and the substrate.

BRIEF DESCRIPTION OF THE DRAWINGS

Embodiments of the invention will now be described, by way of example, with reference to the accompanying drawings, in which.

DETAILED DESCRIPTION OF THE INVENTION

Figure 1:
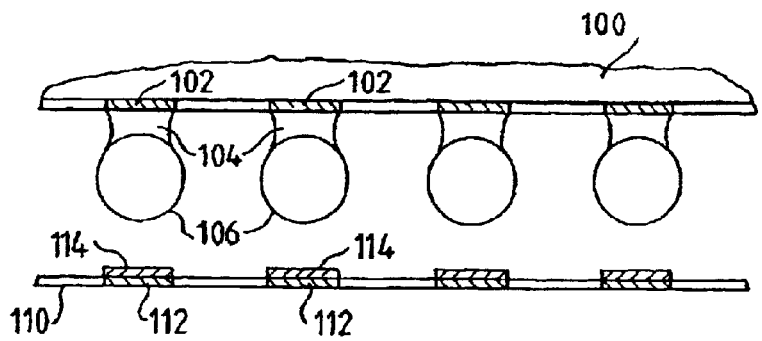
FIG. 1 is a schematic, partial cross-sectional view taken through a known BGA module with solder balls attached thereto and corresponding contacts on a printed circuit board.

FIG. 1 shows a cross-sectional view of a known BGA module having a substrate 100 with solder balls 106 attached to a planar array of contacts 102 located on the substrate, the solder balls adapted for being coupled to corresponding contacts 112 on a printed circuit board 110 is shown. A solder paste 104 is also shown between balls 106 and contacts 102. The contacts 102 are typically round to match the shape of the respective balls 106 and to allow a close spacing sufficient to reliably prevent solder bridging. Contacts 102 are made of a conductive material and may be deposited by known screening or photolithographic processes. The solder balls 106 are joined to the contacts 102 by means of solder paste 104, which is typically a tin-lead solder. The solder paste 104 is applied to the contacts 102, followed by a layer of sticky flux (not shown). The solder balls 106 are located on the contacts 102 and held in place by the sticky flux.

For a ceramic BGA, the solder balls 106 have a higher melting point than the solder paste 104. The solder balls 106 are then reflow joined to the contacts 102 by applying a temperature high enough to melt the solder paste 104, but not high enough to melt the solder balls 106. A planar array of contacts 112 is also arranged on substrate 110. Each of the contacts 112 on substrate 110 corresponds to a contact 102 on substrate 100. Substrate 110 is typically a printed circuit board. A solder paste 114 is deposited on contacts 112.

For a plastic BGA, the above process is followed, except that the solder ball 106 melts and combines with the solder paste 104 to form a single complete ball.

Figure 2:
FIG. 2 is a schematic plan view of a known BGA module and printed circuit board.

FIG. 2 shows a plan view of the BGA module and printed circuit board of FIG. 1. The contacts 102 can be seen as a circle. The ball 106 can be seen as a slightly larger circle. The contacts 112 (shown hidden) can be seen as a circle of size comparable to that of contacts 102.

Figure 3:
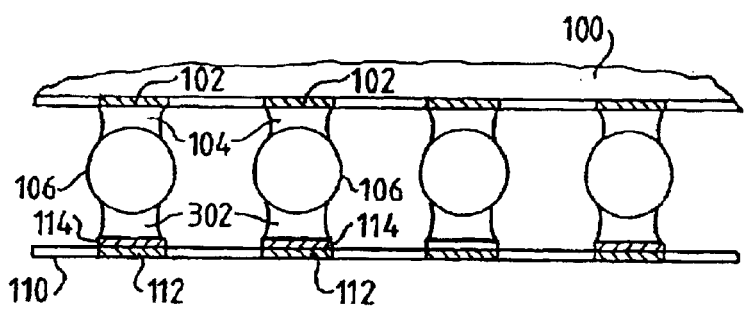
FIG. 3 is a schematic partial cross-section of the known BGA module and printed circuit board of FIG. 2, after the connections have been reflowed successfully.

The substrate 100 and the substrate 110 are brought together so that corresponding contacts on the two substrates are aligned. A temperature high enough to melt the solder paste 114, but not high enough to melt the solder balls 106, is then applied. FIG. 3 shows a cross-section of the BGA module and printed circuit board of FIG. 2 after the connections have been reflowed successfully. Connections exist between each of the solder balls 106 and the contacts 102 by means of the solder paste 104 and between each of the solder balls 106 and the contacts 112 by means of the solder paste 114.

Figure 4:
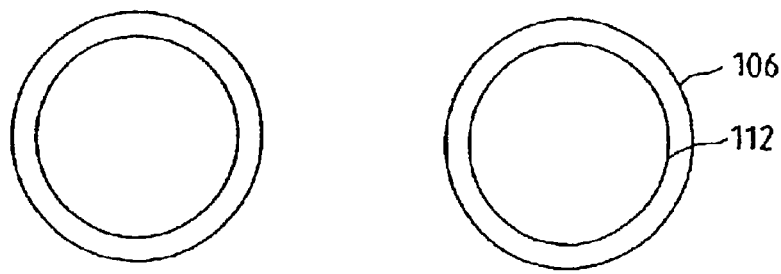
FIG. 4 shows an X-Ray image of the known BGA module and printed circuit board of FIG. 3.

The above BGA module and printed circuit board, with connections successfully made, are now subjected to an X-Ray test to ensure that all the connections are satisfactory. FIG. 4 shows an image of an X-Ray which is taken from above the module, looking through the contact 102, solder paste 104, solder ball 106, solder paste 114 and contact 112. The resulting image shows at the center a darker area (where contact 112 lies over a central portion of the larger ball 106) which corresponds to that of the solder ball 106. A concentric, slightly lighter ring around the darker area corresponds to the contact 112 and the solder paste 114.

Figure 5:
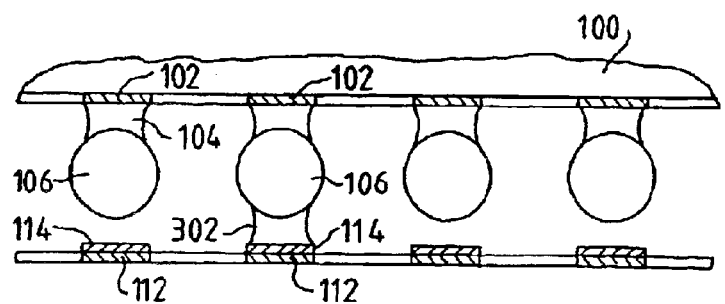
FIG. 5 is a schematic partial cross-sectional view of the known BGA module and printed circuit board of FIG. 2, in which only one connection between the BGA module and the solder ball has been formed during reflow (solder melting)

FIG. 5 shows a cross-section of a BGA module and printed circuit board in which only the connection between BGA module and a singular solder ball has been melted during reflow. Connections exist between each of the solder balls 106 and the contacts 102 by means of solder paste 104. Connection exists between the solder ball 106 and the contact 112, located second from the left hand edge by means of solder paste 114. However, no connection was made between the solder paste 114 and the solder balls 106 in the other three locations.

The BGA module and printed circuit board with its connections are now subjected to the aforementioned X-Ray test to ensure that all the connections are correctly made. The main purpose of this X-Ray test is two-fold: (1) to ensure that there are no short circuit connections; and (2) that none of the solder balls have been displaced from their intended position. When BGA modules and associated printed circuit boards are examined under X-Rays, any open circuit connections to the PCB are difficult to see as a uniform ball 106 is created over the round pad 112 of the PCB, such that all of the connections look round on the X-Ray, whether the connection has been formed or not formed.

Figure 6:
FIG. 6 is a schematic plan view of a BGA module and printed circuit board having quadrilateral contact pads according to the present invention.
Figure 7:
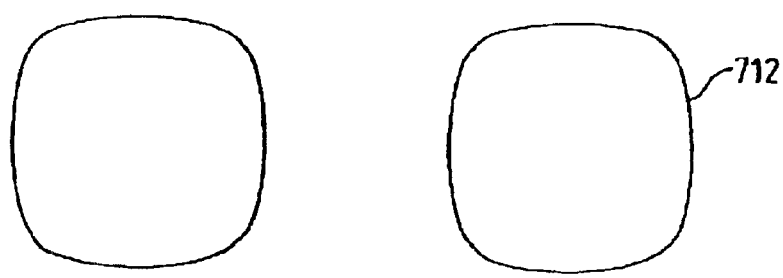
FIG. 7 shows an X-Ray image of the BGA module and printed circuit board of FIG. 6 after the connections have been reflowed successfully.
Figure 8:
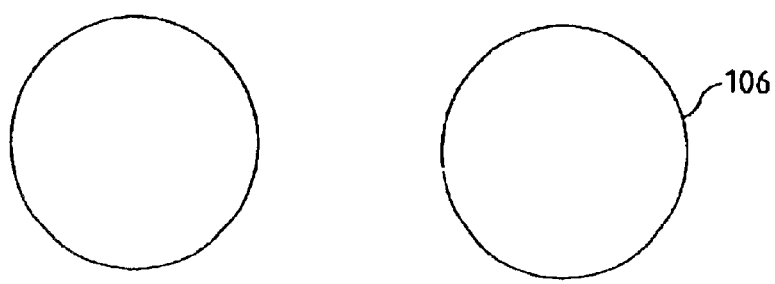
FIG. 8 shows an X-Ray image of the BGA module and printed circuit board of FIG. 6 in which only the connection between BGA module and the solder ball has been melted during reflow.

In the present invention, the footprint of the contacts for Ball Grid Arrays on the printed circuit board is redesigned from being round such as is shown by 112 in FIGS. 1–5 to being square such as is shown by 712 in FIGS. 6–8. By using a square footprint, faulty or open circuit connections are easier to spot under X-Ray examination. If a square pad 712 is used on printed circuit board 110, then a correctly formed connection will present a square appearance if it has been properly soldered. If it has not wetted to the pad, then the solder ball 106 will remain spherical and thus appear round on the X-Ray. This obviously substantially improves the reliability of inspecting BGAs under X-Ray.

FIG. 6 is a schematic plan view of a BGA module and printed circuit board having square contact pads according to the present invention. The round contact 102 on the substrate 100 can be seen, together with the round shape of the solder ball 106. The printed circuit board differs from the board described in FIGS. 1–4 in that the contact 712 is a substantially square shape, rather than being round. In a variation of the embodiment shown, the pad may be rectangular in shape or it may have a slight radius applied to the corners of the square pad. However, the pad should remain substantially quadrilateral in shape, compared to the initially round solder balls.

FIG. 7 shows an X-Ray image which is taken from above the module, looking through the contact 102, solder paste 104, solder ball 106, solder paste 114 and contact 712. The image shows the substantially square shape of the contact pad 712 clearly visible, indicating that the contact pad 712 has been wetted and a good connection made.

FIG. 8 shows an X-Ray image of the BGA module and printed circuit board of FIG. 6 in which no connection between the right side part of the BGA module and respective solder balls (only the two on the right side) has occurred. The image is taken from above the module and printed circuit board looking through the top contact 102, first solder paste 104, solder ball 106, second solder paste 114 and bottom contact 712. The image shows the round shape of the solder ball 106 clearly visible, but not the substantially square shape of the underlying contact 712, indicating that the contact 712 has not been wetted and a good connection has not been made.

While there have been shown and described what are at present the preferred embodiments of the invention, it will be obvious to those skilled in the art that various changes and modifications may be made therein without departing from the scope of the invention as defined by the appended claims.

What is claimed is:

1. An electrical structure, comprising:
   a substrate for the attachment of a ball grid array electronic package thereto by means of solder balls and solder paste wherein connection is made between a contact on the ball grid array electronic package and a solder ball by means of a first joining medium and between said solder ball; and a substrate contact arranged on the substrate wherein the contact arranged on the substrate is substantially quadrilateral in shape and has at least one transverse dimension greater than a diameter of said solder ball, wherein said substrate contact is configured on the substrate in relation to the solder ball such that an x-ray through said electronic package illuminates said solder ball and said contact, so that a bad joint shows in an x-ray image resulting from said x-rays as a round image of said solder ball and a good joint, in which said solder ball (tows into said substantially quadrilateral shape, shows in said x-ray image as a quadrilateral image.

2. The electrical structure of claim 1, wherein the contact arranged on the substrate is substantially square in shape; so that a good joint shows in said x-rays as a square shape.

3. The electrical structure of claim 1, wherein the joining medium is solder paste.

4. The electrical structure of claim 1, wherein said solder ball has an initial, substantially round shape prior to making said connections.

5. The electrical structure of claim 1, wherein said contact has a thickness less than a thickness of said solder ball and a surface adapted for flowing said solder throughout said transverse dimension, so that in a good joint material from said solder ball flows to cover the transverse extent of said contact and produces an image different from a corresponding image of a bad joint.

6. The electrical structure of claim 5, wherein said surface adapted for flowing said solder throughout said transverse dimension is substantially planar, so that solder flow is unimpeded.

7. The electrical structure of claim 2, wherein said at least one transverse dimension is a diagonal of said quadrilateral that is greater in length than a corresponding diameter of said solder ball.

* * * * *